(12) United States Patent
Adam et al.

(10) Patent No.: US 9,190,471 B2
(45) Date of Patent: Nov. 17, 2015

(54) SEMICONDUCTOR STRUCTURE HAVING A SOURCE AND A DRAIN WITH REVERSE FACETS

(75) Inventors: Thomas N. Adam, Slingerlands, NY (US); Kangguo Cheng, Schenectady, NY (US); Ali Khakifirooz, Mountain View, CA (US); Jinghong Li, Poughquag, NY (US); Alexander Reznicek, Mount Kisco, NY (US)

(73) Assignee: GLOBALFOUNDRIES U.S.2 LLC, Hopewell Junction, NY (US)

(*) Notice: Subject to any disclaimer, the term of this patent is extended or adjusted under 35 U.S.C. 154(b) by 779 days.

(21) Appl. No.: 13/446,350

(22) Filed: Apr. 13, 2012

(65) Prior Publication Data

US 2013/0270611 A1    Oct. 17, 2013

(51) Int. Cl.
| | |
|---|---|
| H01L 29/76 | (2006.01) |
| H01L 21/336 | (2006.01) |
| H01L 29/06 | (2006.01) |
| H01L 29/66 | (2006.01) |
| H01L 29/78 | (2006.01) |
| H01L 29/08 | (2006.01) |
| H01L 21/84 | (2006.01) |

(52) U.S. Cl.
CPC ........ *H01L 29/0657* (2013.01); *H01L 29/0847* (2013.01); *H01L 29/66636* (2013.01); *H01L 29/78* (2013.01); *H01L 21/84* (2013.01)

(58) Field of Classification Search
None
See application file for complete search history.

(56) References Cited

U.S. PATENT DOCUMENTS

| | | | |
|---|---|---|---|
| 7,396,407 B2 | 7/2008 | Saenger et al. | |
| 7,687,383 B2 | 3/2010 | Bauer | |
| 7,759,199 B2 | 7/2010 | Thomas et al. | |
| 7,781,290 B2 | 8/2010 | Lee et al. | |
| 7,816,236 B2 | 10/2010 | Bauer et al. | |
| 7,939,399 B2 * | 5/2011 | Mowry et al. | 438/199 |
| 7,989,298 B1 * | 8/2011 | Chan et al. | 438/300 |
| 8,093,634 B2 * | 1/2012 | Mowry et al. | 257/288 |
| 8,754,448 B2 * | 6/2014 | Liao et al. | 257/192 |
| 8,853,752 B2 * | 10/2014 | Bazizi et al. | 257/288 |

(Continued)

OTHER PUBLICATIONS

H. Shin et al., "Formation of macroscopic steps during selective area metalorganic chemical vapor deposition on GaAs (0 0 1) vicinal substrates," Journal of Crystal Growth, vol. 177, 1997, pp. 33-40. The Year of Publication Is Sufficiently Earlier Than Applicants' Effective US and Foreign Filing Date Such That the Particular Month of Publication Is Not an Issue.

S.-Y. Lee et al., "Sub-25nm single-metal gate CMOS multi-bridge-channel MOSFET (MBCFET) for high performance and low power application," 2005 Symposium on VLSI Technology Digest of Technical Papers, Jun. 14-16, 2005, pp. 154-155.

(Continued)

*Primary Examiner* — Mark Tornow
*Assistant Examiner* — Priya Rampersaud
(74) *Attorney, Agent, or Firm* — Law Offices of Ira D. Blecker, P.C.

(57) ABSTRACT

A semiconductor structure including a semiconductor wafer. The semiconductor wafer includes a gate structure, a first trench in the semiconductor wafer adjacent to a first side of the gate structure and a second trench adjacent to a second side of the gate structure, the first and second trenches filled with a doped epitaxial silicon to form a source in the filled first trench and a drain in the filled second trench such that each of the source and drain are recessed and have an inverted facet. In a preferred exemplary embodiment, the epitaxial silicon is doped with boron.

11 Claims, 4 Drawing Sheets

(56) References Cited

U.S. PATENT DOCUMENTS

| | | | |
|---|---|---|---|
| 2007/0004123 A1* | 1/2007 | Bohr et al. | 438/230 |
| 2007/0254414 A1* | 11/2007 | Miyanami | 438/149 |
| 2009/0075029 A1* | 3/2009 | Thomas et al. | 428/173 |
| 2009/0101942 A1* | 4/2009 | Dyer | 257/288 |
| 2010/0255661 A1 | 10/2010 | Vatus et al. | |
| 2011/0024801 A1* | 2/2011 | Cheng et al. | 257/255 |
| 2011/0101421 A1 | 5/2011 | Xu | |
| 2011/0233688 A1* | 9/2011 | Ren et al. | 257/408 |
| 2012/0025315 A1* | 2/2012 | Kronholz et al. | 257/365 |
| 2012/0091469 A1* | 4/2012 | Park et al. | 257/77 |
| 2012/0205715 A1* | 8/2012 | Kwok et al. | 257/190 |
| 2012/0319203 A1* | 12/2012 | Cheng et al. | 257/346 |
| 2013/0092954 A1* | 4/2013 | Yang et al. | 257/77 |
| 2014/0001561 A1* | 1/2014 | Cheng et al. | 257/369 |
| 2014/0134818 A1* | 5/2014 | Cheng et al. | 438/300 |

OTHER PUBLICATIONS

S.-Y. Lee et al., "A novel sub-50 nm multi-bridge-channel MOSFET (MBCFET) with extremely high performance," 2004 Symposium on VLSI Technology Digest of Technical Papers, Jun. 15-17, 2004, pp. 200-201.

B. Yang et al., "CMOS Fabricated by Hybrid-Orientation Technology (HOT)," Proceeding of 2007 International Workshop on Electron Devices and Semiconductor Technology, EDST, Jun. 3-4, 2007, pp. 8-13.

K. Cheng et al., "Fully depleted extremely thin SOI technology fabricated by a novel integration scheme featuring implant-free, zero-silicon-loss, and faceted raised source/drain," 2009 Symposium on VLSI Technology, Jun. 16-18, 2009, pp. 212-213.

* cited by examiner

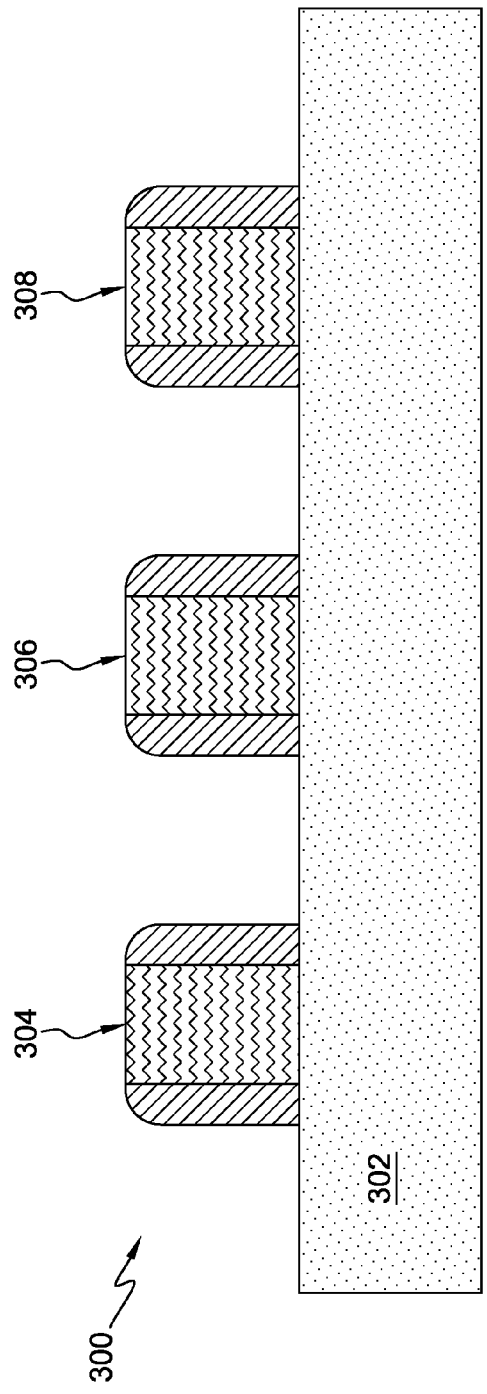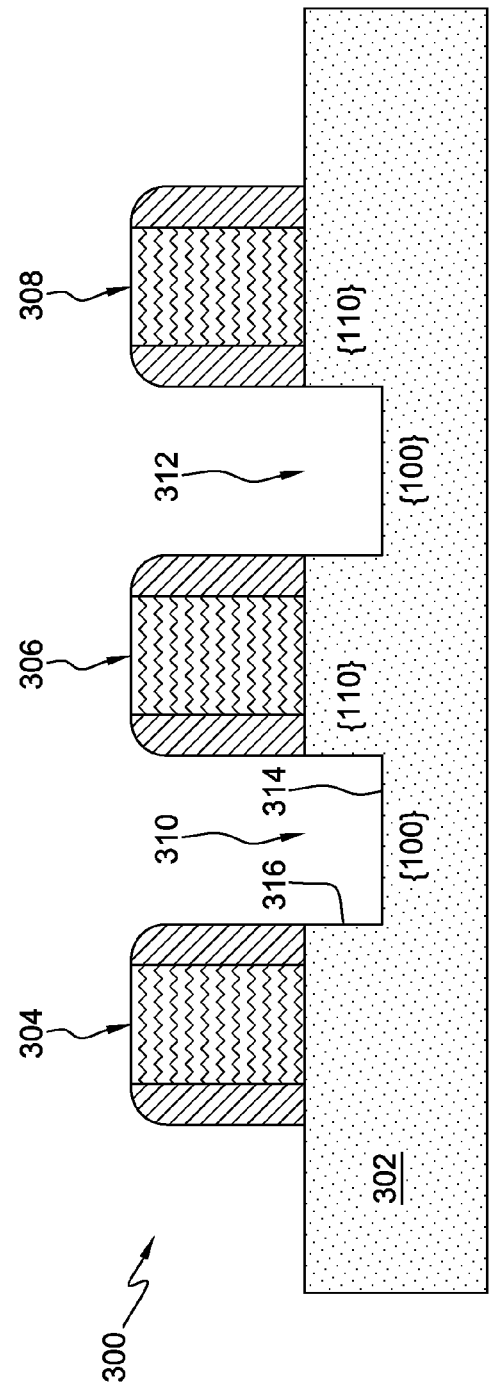

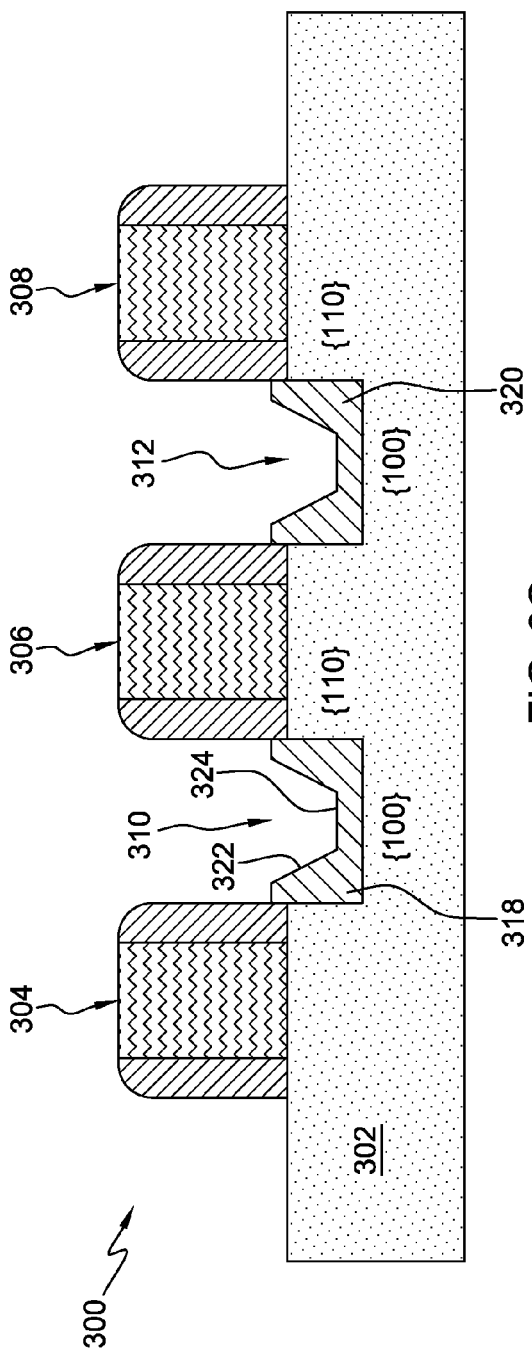
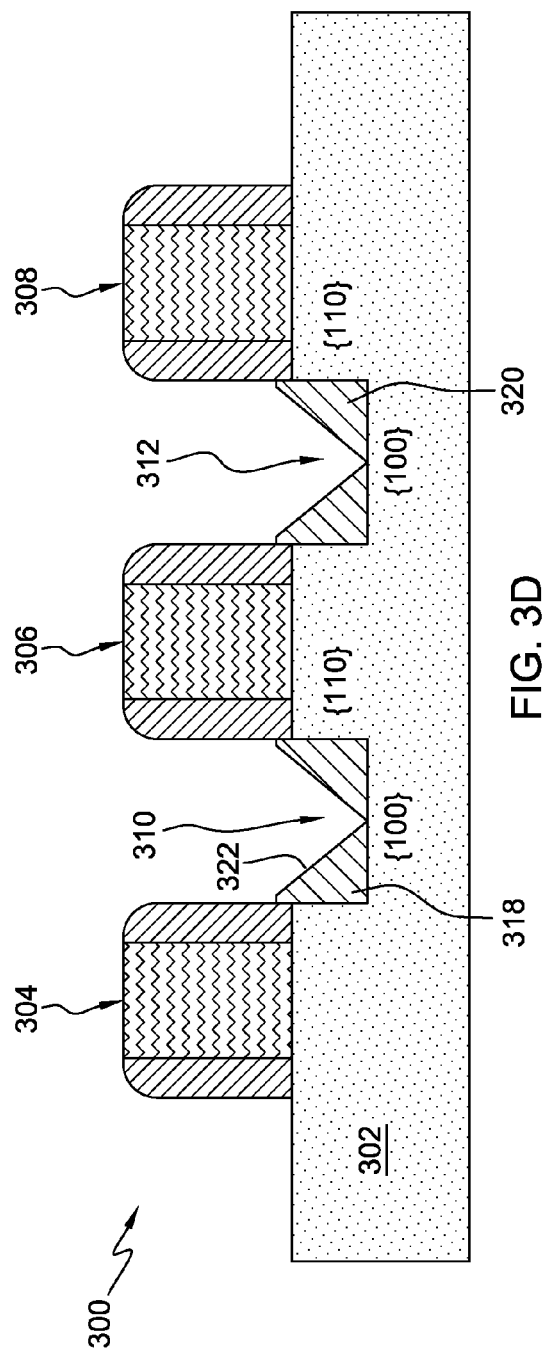

SEMICONDUCTOR STRUCTURE HAVING A SOURCE AND A DRAIN WITH REVERSE FACETS

BACKGROUND

The present application relates to semiconductor structures and, more particularly, relates to semiconductor structures having a faceted source and drain in which the facet is reversed so as to form a recessed source and drain.

Methods of enhancing the performance of semiconductor materials are of considerable interest and have potential applications in a variety of semiconductor processing applications. Semiconductor processing is typically used in the fabrication of semiconductor structures. A typical semiconductor structure may consist of a gate structure and a source on one side of the gate structure and a drain on the other side of the gate structure. There may be a capacitance between the source/drain and the gate structure.

BRIEF SUMMARY

The various advantages and purposes of the exemplary embodiments as described above and hereafter are achieved by providing, according to a first aspect of the exemplary embodiments, a semiconductor structure including a semiconductor wafer. The semiconductor wafer includes a gate structure, a first trench in the semiconductor wafer adjacent to a first side of the gate structure and a second trench adjacent to a second side of the gate structure, the first and second trenches filled with a doped epitaxial silicon to form a source in the filled first trench and a drain in the filled second trench such that each of the source and drain are recessed and have an inverted facet.

According to a second aspect of the exemplary embodiments, there is provided a method of forming a semiconductor structure which includes obtaining a semiconductor wafer; forming a gate structure on the wafer; forming trenches for a source and a drain adjacent to the gate structure; and epitaxially growing a doped silicon to partially fill the trenches to form a recessed source and drain having an inverted facet, the recessed source and drain having angled walls extending from an outer periphery of the source and drain towards a center and a bottom of the source and drain.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 3A to 3C are cross-sectional views that illustrate processes for forming a first exemplary embodiment of a semiconductor wafer having source and drain recesses filled with doped silicon to form inverted facets.

FIG. 3D is a cross-sectional view that illustrates a second exemplary embodiment of a semiconductor wafer having source and drain recesses filled with doped silicon to form inverted facets.

DETAILED DESCRIPTION

Figure 1:
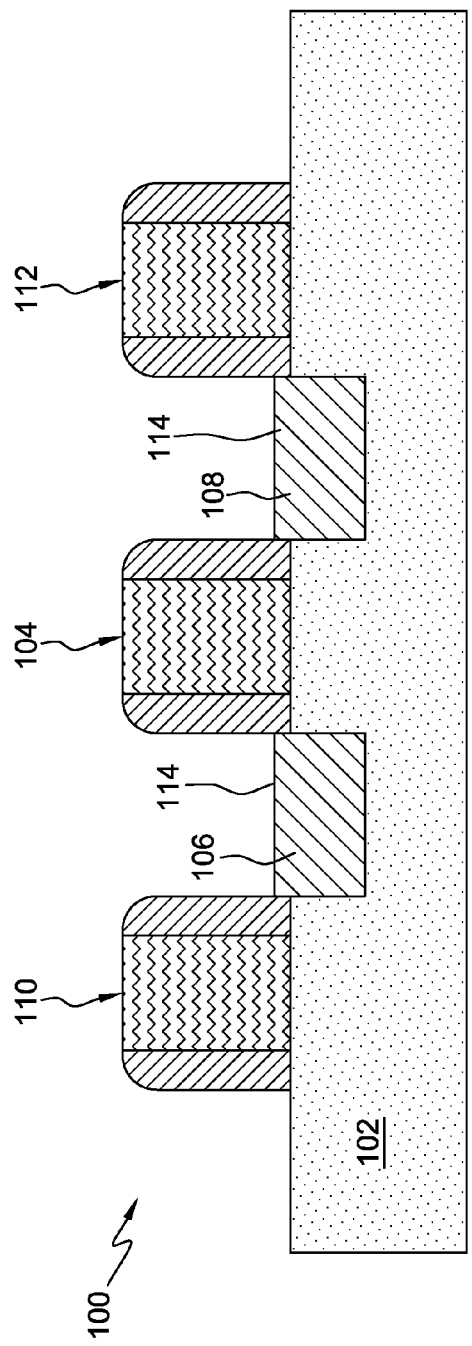
FIG. 1 is a cross-sectional view of a conventional semiconductor structure including a silicon wafer having source and drain recesses filled with silicon germanium.

Referring to the Figures in more detail, and particularly referring to FIG. 1, there is shown a typical conventional semiconductor structure 100 which may include a silicon wafer 102 having a plurality of gate structures, such as gate structures 104, 110, 112. Adjacent to the gate structure 104 may be a source 106 and drain 108. The positions of the source 106 and drain 108 may be reversed. Additionally, the source 106 and drain 108 may be shared with other gate structures such as gate structures 110 and 112. The semiconductor wafer 102 may be a single crystal structure. In the conventional structure shown in FIG. 1, it may be desirable for source 106 and drain 108 to be selectively epitaxially grown from the single crystal wafer 102 so as to maintain the single crystal structure. Source 106 and drain 108 may be filled with, for example, silicon germanium. It is noted that source 106 and drain 108 have a flat surface and may be slightly overfilled as shown in FIG. 1 or may be flush with the surface of the semiconductor wafer 102.

The semiconductor structure 100 may be formed by forming trenches adjacent to the gate structure 104 and then filling the trenches with, for example, epitaxial silicon germanium, to add a strained component to the semiconductor wafer 102. The silicon germanium may be doped or undoped.

The foregoing process should be contrasted with the conventional way of forming sources and drains by simply implanting a dopant into the semiconductor material adjacent to the gate structure 104.

Figure 2:
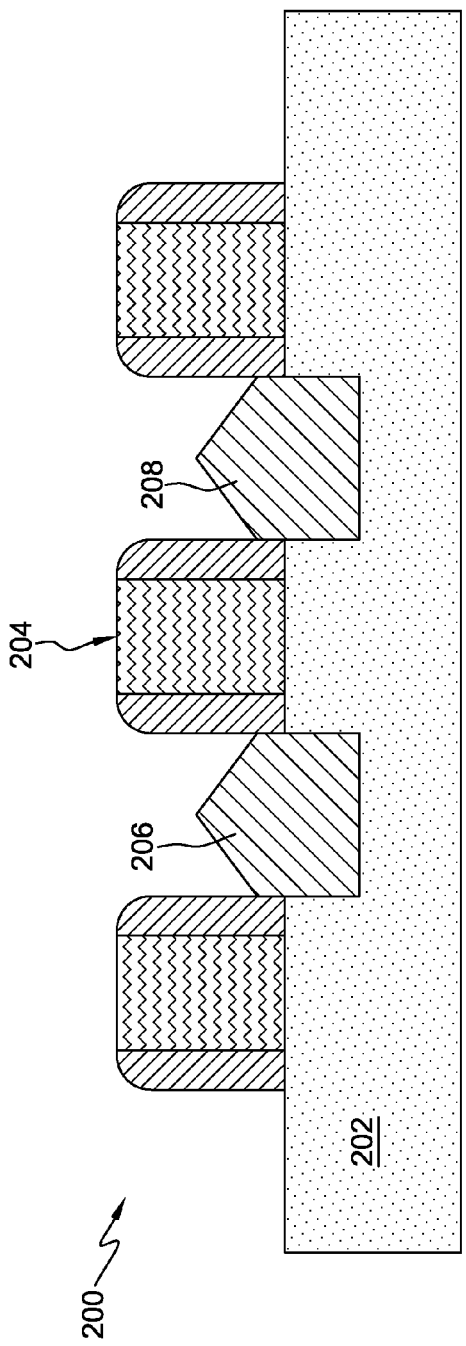
FIG. 2 is a cross-sectional view of a conventional semiconductor structure including a silicon wafer having source and drain recesses filled with silicon germanium that forms facets.

Referring now to FIG. 2, semiconductor structure 200 is similar to semiconductor structure 100 except that semiconductor structure 200 may have a "faceted" source 206 and drain 208 adjacent to gate structure 204. Again, source 206 and drain 208 may be slightly overfilled as shown in FIG. 2 or may be flush with the surface of the semiconductor wafer 202 (that is, a corner of the facet would be flush with the surface of the semiconductor wafer 202).

Faceting of the faceted source 206 and drain 208 may be tailored during the selective epitaxial deposition process by adjusting the reactor temperature, pressure, and etchant and precursor flows.

Instead of completely filling the trenches in the semiconductor wafer 102, 202, the trenches may be partially filled such as bottom only fill, sidewall only fill and conformal fill where the sidewalls and bottom are equally filled.

In each of the semiconductor structures 100, 200 there is a capacitance between the gate structures, such as gate structure 104 in FIG. 1 and gate structure 204 in FIG. 2, and the respective sources and drains, such as source 106 and drain 108 in FIG. 1 and source 206 and drain 208 in FIG. 2. It would be desirable to be able to reduce the capacitance between the source/drain and the gate structure.

Referring now to FIGS. 3A to 3C, there is illustrated a process for forming a first exemplary embodiment of a semiconductor structure 300. The semiconductor structure 300 that is formed is preferably a p-type field effect transistor (PFET).

Referring first to FIG. 3A, there is illustrated in cross-sectional view a semiconductor wafer 302 having a plurality of gate structures 304, 306, 308. Each gate structure may include a gate and spacers although the precise structure of the gate structures 304, 306, 308 is not important to the present invention. It should be understood that there will be typically many more such gate structures on a typical semiconductor wafer.

It should also be understood that all of the devices to be formed in semiconductor structure 300 preferably are PFET devices. Semiconductor structure 300 may also include n-type field effect transistors (NFETs) and in that case, the PFETs may be separated from the NFETs by shallow trench isolation or other means.

The semiconductor wafer 302 may be any semiconductor wafer including a bulk semiconductor wafer or, a semiconductor on insulator (SOI) wafer that may include an active SOI layer of a semiconductor, such as silicon, a semiconductor substrate, and a buried insulator layer, such as an oxide, that separates and electrically isolates the semiconductor substrate from the SOI layer. The semiconductor material making up a bulk semiconductor wafer may be any semiconductor material, including but not limited to, silicon, silicon germanium, germanium, a III-V compound semiconductor, or a II-VI compound semiconductor. Similarly, for an SOI wafer, the active SOI layer may be any semiconductor material, including but not limited to, silicon, silicon germanium, germanium, a III-V compound semiconductor, or a II-VI compound semiconductor. The semiconductor substrate of the SOI wafer also may be any semiconductor material, including but not limited to, silicon, silicon germanium, germanium, a III-V compound semiconductor, or a II-VI compound semiconductor but is usually just silicon.

It is most preferred that if the semiconductor wafer 302 is a bulk semiconductor wafer, the semiconductor material is silicon and if the semiconductor wafer 302 is an SOI wafer, the semiconductor material in the active SOI layer is silicon.

Referring now to FIG. 3B, trenches 310 and 312 have been formed in the semiconductor wafer 302 adjacent to gate structure 306. If the semiconductor wafer 302 is an SOI wafer, the trenches 310, 312 typically should not extend past the SOI layer into the buried insulator layer. The trenches 310, 312 may be formed by a conventional process such as reactive ion etching (RIE). The gate structures 304, 306, 308 may be masked off during the RIE process. Such masking is not shown for clarity. After the RIE to form the trenches 310, 312, the semiconductor wafer 302 may undergo a preclean process to remove any RIE residue. Such a preclean process, for purposes of illustration and not limitation, may include sulfuric acid plus peroxide or dilute hydrofluoric acid (HF). There may be an additional preclean process consisting of a plasma-assisted dry cleaning.

Miller indices form a notation system in crystallography for planes and directions in crystal (Bravais) lattices. In particular, a family of lattice planes may be determined by three integers h, k, and l, the Miller indices. They are written (hkl), and each index denotes a plane orthogonal to a direction (h, k, l) in the basis of the reciprocal lattice vectors. The integers are usually written in lowest terms, i.e. their greatest common divisor should be 1. Miller index 100 represents a plane orthogonal to direction h; index 010 represents a plane orthogonal to direction k, and index 001 represents a plane orthogonal to l. There are also several related notations. The notation {hkl} denotes the set of all planes that are equivalent to (hkl) by the symmetry of the lattice. For example, the notation {100} is meant to indicate that the crystal plane orientation may be any of the family of (100) planes such as (100), (010), (001), etc. When notations such as {100} or (100) are used herein, these notations shall be deemed to be the Miller indices notations.

Semiconductor wafer 302 may be oriented such that trenches 310, 312 include a bottom surface 314 that may have a crystal plane orientation such as {100}, and side surfaces 316 that may have a crystal plane orientation such as {110}. The notation {100} with respect to the bottom surface 314 is meant to indicate that the crystal plane orientation of the bottom surface 314 may be any of the family of (100) planes such as (100), (010), (001), etc. Similarly, the notation {110} with respect to the side surfaces 316 is meant to indicate that the crystal plane orientation of the side surfaces 316 may be any of the family of (110) planes such as (110), (101), (011), etc. It has been found that the semiconductor wafers having crystal plane orientations such as that just described work well for the exemplary embodiments but it should be understood that semiconductor wafers having other crystal plane orientations are not excluded from the exemplary embodiments.

The semiconductor wafer 302 may be placed in an EPI chamber (i.e., a chamber for the growth of epitaxial material) and epitaxial silicon (i.e., not an alloy or compound of silicon) may be grown in trenches 310, 312 by a selective epitaxial process to form source 318 and drain 320. The terms "epitaxial" and "epitaxially" and similar terms are used herein to refer to the deposition of a crystalline silicon-containing material onto a crystalline substrate in such a way that the deposited layer adopts or follows the lattice constant of the semiconductor wafer. In the exemplary embodiments, the crystalline-containing material and the crystalline substrate are both preferably silicon. The positions of the source 318 and drain 320 may be reversed depending on the design of the semiconductor structure 300. Referring to FIG. 3C, the present inventors have found that a "reverse facet" or "inverted facet" may be obtained for the source 318 and drain 320 by selectively depositing epitaxial silicon while doping with boron. By reverse facet or inverted facet, it is meant that the source 318 and drain 320 are recessed and have angled walls 322 that extend downwardly and toward the center of the source 318 and drain 320. In the exemplary embodiment illustrated in FIG. 3C, the angled walls 322 of the source 318 and drain 320 may meet in a flat bottom 324. Source 318 and drain 320 may be slightly overfilled as shown in FIG. 3C or may be flush with the surface of the semiconductor wafer 302 (that is, a corner of the facet would be flush with the surface of the semiconductor 302).

Process conditions during the selective epitaxial process include a chemical vapor deposition (CVD) process in which silane ($SiH_4$) and/or Dichlorosilane ($H_2SiCl_2$), and HCl gas for selectivity and a boron-containing precursor such as Diborane ($B_2H_6$) gas (other boron-containing precursors may include but not be limited to borontrichloride (BCl3)) may be fed into the epitaxial process reactor plus hydrogen as carrier gas at a pressure of about 2 to 600 torr with 10 to 80 torr being preferred and temperature of about 600 to 850° C. with 650 to 750° C. being preferred. The partial pressure of the boron-containing precursor (such as Diborane) concentration should be relatively high. For example, in a reduced pressure (RP) CVD chamber having a process pressure of about 10 to 80 torr and a carrier gas flow of about 2 to 50 standard liters per minute (SLM), the partial pressure of Diborane may be about 0.1 to 100 mtorr. The resulting boron concentration in the faceted source 318 and drain 320 should be about $1 \times 10^{19}$ to $8 \times 10^{20}$ atoms/$cm^3$.

Figure 4:
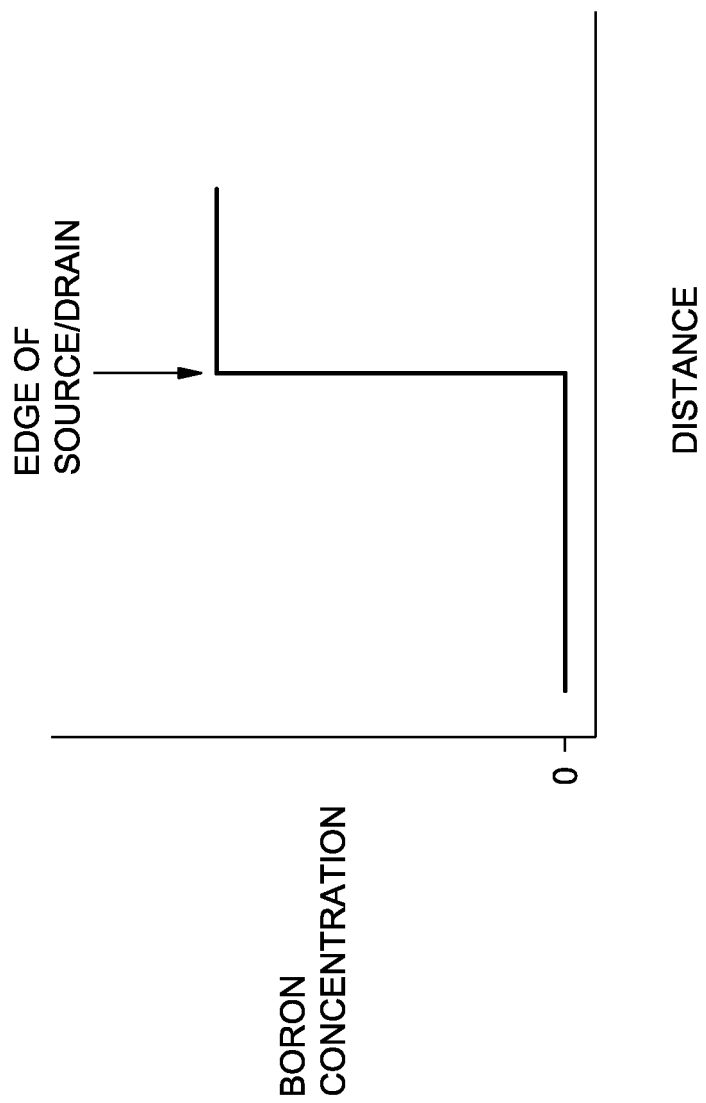
FIG. 4 is a graph illustrating the boron dopant concentration at an edge of a source or drain.

FIG. 4 illustrates a doping profile for a source or drain such as that shown in FIG. 3C. Just outside the source or drain, the boron concentration is nil or practically nil. At the edge of the source or drain and continuing toward the center of the source or drain, the boron concentration increases abruptly to the boron concentration indicated above. Such an abrupt discontinuity in the dopant concentration is not observed when the already-deposited semiconductor material is doped by implanting as is conventional in the prior art.

As noted above, reverse or inverted facets may be obtained according to the exemplary embodiments. While not wishing to be held to a particular theory, the present inventors believe the combination of a preclean process consisting of a plasma-assisted dry cleaning process and the boron with the silicon in the selective epitaxial deposition process and under the above process conditions causes the boron-doped silicon to grow preferentially from the side walls ({110} plane) and more slowly from the bottom ({100} plane) of the trenches 310 and 312. Eventually, growth slows down on the {111} plane orientation which forms the angled walls 322 of the source 318 and drain 320. The result is the recessed source 318 and drain 320 in a reverse or inverted facet orientation.

The plasma-assisted dry cleaning process may include an etchant gas of at least one of nitrogen trifluoride ($NF_3$), ammonia ($NH_3$) or the like. In some embodiments, the etchant gas may nitrogen trifluoride ($NF_3$) and ammonia ($NH_3$). The plasma-assisted dry cleaning process may proceed at a temperature of about room temperature to about 30° C.

The formation of the recessed source 318 and drain 320 have the added advantage of decreasing the capacitance between the source 318 and gate structure 306 and drain 320 and gate structure 306 during contact formation. In addition, there may be greater contact area between the source 318 and drain 320 and a contact that will eventually be formed to connect the source 318 and drain 320 and the next level of wiring.

Referring now to FIG. 3D, the process may be allowed to continue until the angled walls 322 actually meet so that there is no longer a flat bottom to the recessed source 318 and drain 320.

Boron is a p-type dopant so the exemplary embodiments are most useful for the formation of pFET devices. The present inventors have demonstrated the effectiveness of the exemplary embodiment with boron as the dopant. The exemplary embodiments may be extended to the use of other p-type dopants such as boron fluoride (BF2) or aluminum-, gallium-, indium- or thalium-containing precursors.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
a semiconductor wafer comprising a gate structure, a first trench in the semiconductor wafer adjacent to a first side of the gate structure and a second trench adjacent to a second side of the gate structure, the first and second trenches each having vertical sides at a 90 degree angle with respect to a bottom of the trench and filled with an epitaxial silicon that is not an alloy or compound of silicon and is doped to form a doped epitaxial silicon to form a source in the filled first trench and a drain in the filled second trench such that each of the source and drain are recessed and have an inverted facet wherein the inverted facet comprises vertical side walls at the vertical sides at an outer periphery of the source and drain and angled walls that extend from the vertical side walls towards a center and a bottom of the source and drain.

2. The structure of claim 1 wherein the doped epitaxial silicon is doped with boron.

3. The structure of claim 2 wherein the concentration of the boron is $1\times10^{19}$ to $8\times10^{20}$ atoms/cm$^3$.

4. The structure of claim 1 wherein the doped epitaxial silicon is doped with aluminum, gallium, indium or thallium and combinations thereof.

5. The structure of claim 1 wherein the first and second trenches each have a bottom surface and a side surface and the semiconductor wafer is oriented such that the bottom surface of the first and second trenches has a crystal plane orientation of {100} and the side surface of the first and second trenches has a crystal plane orientation of {110}.

6. The structure of claim 1 wherein a bottom of the recessed source and drain is flat.

7. The structure of claim 1 wherein a bottom of the recessed source and drain is flat and the angled walls meet the bottom.

8. The structure of claim 1 wherein the angled walls meet at the center of the source and drain.

9. The structure of claim 1 wherein the angled walls have a crystal plane orientation of {111}.

10. The structure of claim 1 wherein the semiconductor wafer is a bulk semiconductor wafer consisting of silicon or a semiconductor on insulator wafer having an active layer consisting of silicon.

11. A semiconductor structure comprising:
a semiconductor wafer comprising a gate structure, a first trench in the semiconductor wafer adjacent to a first side of the gate structure and a second trench adjacent to a second side of the gate structure, the first and second trenches each having vertical sides at a 90 degree angle with respect to a bottom of the trench and filled with a doped epitaxial silicon consisting of silicon and a dopant selected from the group consisting of boron, aluminum, gallium, indium and thallium to form a source in the filled first trench and a drain in the filled second trench such that each of the source and drain are recessed and have an inverted facet wherein the inverted facet comprises vertical side walls at eth vertical sides at an outer periphery of the source and drain and angled walls that extend from the vertical side walls towards a center and a bottom of the source and drain.

* * * * *